(12) United States Patent
Tsai et al.

(10) Patent No.: US 9,231,549 B2
(45) Date of Patent: Jan. 5, 2016

(54) PHASE SHIFTER AND AND RELATED LOAD DEVICE

(75) Inventors: Ming-Da Tsai, Miaoli County (TW); Jing-Hong Conan Zhan, HsinChu (TW); Arun Natarajan, White Plains, NY (US)

(73) Assignees: MEDIATEK INC., Science-Based Industrial Park, Hsin-Chu (TW); International Business Machines Corporation, Armonk, NY (US)

( * ) Notice: Subject to any disclaimer, the term of this patent is extended or adjusted under 35 U.S.C. 154(b) by 393 days.

(21) Appl. No.: 13/380,511

(22) PCT Filed: Aug. 10, 2009

(86) PCT No.: PCT/CN2009/073156
§ 371 (c)(1),
(2), (4) Date: Dec. 22, 2011

(87) PCT Pub. No.: WO2011/017829
PCT Pub. Date: Feb. 17, 2011

(65) Prior Publication Data
US 2012/0105172 A1    May 3, 2012

(51) Int. Cl.
*H01P 1/18* (2006.01)
*H03H 7/20* (2006.01)

(52) U.S. Cl.
CPC ...................... *H03H 7/20* (2013.01)

(58) Field of Classification Search
CPC ........................................... H03H 7/20
USPC ............................................. 333/164
See application file for complete search history.

(56) References Cited

U.S. PATENT DOCUMENTS

| | | | |
|---|---|---|---|
| 3,882,431 A * | 5/1975 | Hopwood et al. | 333/139 |
| 7,164,330 B2 | 1/2007 | Eom | |
| 2005/0270122 A1* | 12/2005 | Hyman et al. | 333/164 |

(Continued)

FOREIGN PATENT DOCUMENTS

| | | |
|---|---|---|
| CN | 2341322 Y | 9/1999 |
| TW | 200832902 | 8/2008 |
| WO | 9939401 A1 | 8/1999 |

OTHER PUBLICATIONS

Krafcsik et al., A Dual-Varactor Analog Phase Shifter Operating at 6 to 18 GHz, Dec. 1988, IEEE Transactions on Microwave Theory and Techniques, vol. 36 No. 12, Dec. 1988, pp. 1938-1941.*
Xiao et al., A Wideband 360 Analog Phase Shifter Design, Canadian Conference on Electrical and Computer Engineering, 2009. Issue Date: May 3-6, 2009, p. 524-527.*

(Continued)

*Primary Examiner* — Stephen E Jones
*Assistant Examiner* — Scott S Outten
(74) *Attorney, Agent, or Firm* — Winston Hsu; Scott Margo

(57) ABSTRACT

A phase shifter and related load device are provided. The phase shifter includes a phase shifter core and load devices. The phase shifter core has an input port for receiving an input signal, an output port for outputting an output signal, and connection ports. The load devices are coupled to the connection ports, respectively. At least one of the load devices includes first varactor units each having a first node and a second node, where first nodes of the first varactor units are coupled to a first voltage, second nodes of the first varactor units are respectively coupled to a plurality of second voltages, and the second voltages include at least two voltages different from each other. The phase shifter and related load device are capable of mitigating effects resulted from varactor's non-linear C-V curve.

18 Claims, 15 Drawing Sheets

(56) References Cited

U.S. PATENT DOCUMENTS

2006/0198235 A1* 9/2006 Mohanavelu et al. ........ 365/233
2008/0012654 A1   1/2008 Han
2008/0111642 A1   5/2008 Bohorquez

OTHER PUBLICATIONS

"International Search Report" mailed on May 20, 2010 for International application No. PCT/CN2009/073156, International filed:Aug. 10, 2009.

* cited by examiner

PHASE SHIFTER AND AND RELATED LOAD DEVICE

FIELD OF INVENTION

The present invention relates to linearizing a C-V curve of a varactor device, and more particularly, to a phase shifter and related load device with linearization technique employed therein to mitigate effects resulted from varactor's non-linear C-V curve.

BACKGROUND OF THE INVENTION

Phase shifters are common components employed in a variety of wireless communication applications. For example, a phased-array receiver requires phase shifters to achieve desired beamforming. Particularly, a phase shifter is one of the key components for non-light of sight (NLOS) applications. Please refer to FIG. 1, which is a diagram illustrating a conventional reflection-type phase shifter. The conventional reflection-type phase shifter 100 includes a quadrature coupler 102 and a plurality of load devices 104A and 104B. As shown in FIG. 1, the quadrature coupler 102 includes an input port denoted by P1, a through port denoted by P2, a coupled port denoted by P3, and an isolated port (output port) denoted by P4. The quadrature coupler 102 is also called 90 degree hybrid coupler used for dividing an input signal S_IN into two signals 90 degrees out of phase.

The load devices 104A and 104B are implemented to serve as reflection loads, respectively. Each of the conventional load devices 104A and 104B includes a transmission line L, a bypass capacitor Cbypass, and a plurality of varactors C1. The signals respectively reflected from the load devices 104A and 104B are combined at the isolated port (output port) P4, resulting in an output signal S_OUT induced at the isolated port (output port) P4. The conventional reflection-type phase shifter 100 can be used to provide any desired phase shift through properly tuning the capacitive values (capacitance values) of the varactors C1 implemented in the load devices 104A and 104B. In other words, the conventional phase shifter 100 employs the varactors C1 to provide phase tuning functionality for steering the signal beam angle.

However, the phase tuning curve of the phase shifter 100 is non-linear due to the varactor's non-linear C-V curve, as shown in FIG. 2. As can be seen from FIG. 2, the capacitance value C is increased/decreased non-linearly when the control voltage V applied to the varactor is increased/decreased. Specifically, when the control voltage V is within a specific range, the slope of the C-V curve is sharp, implying that a digital-to-analog converter (DAC) for setting the control voltage V of the varactor is generally required to have high resolution to properly set a desired capacitance value to the varactor. A digital compensation scheme is therefore proposed to apply pre-distortion to the incoming digital control value, thereby making the overall phase tuning curve become more linear, if the pre-distortion characteristic of the digital control value is taken into consideration.

Linearizing the phase-tuning curve of the phase shifter 100 can simplify the actual implementation of the digital compensation scheme, and save the digital-block area (e.g., a lookup table) accordingly. Besides, as the DAC conversion noise is severe when the control voltage of the varactor is within the aforementioned specific range, where the slope of the C-V curve is sharp, linearizing the C-V curve to reduce the slope can effective reduce the DAC conversion noise passed to the following signal processing stage(s).

Therefore, an innovative and efficient means to linearize the non-linear characteristic of an application device (e.g., the non-linear phase-tuning curve of the phase shifter) caused by the varactor's non-linear C-V curve is highly demanded.

SUMMARY OF THE INVENTION

In accordance with exemplary embodiments of the present invention, a phase shifter and related load device with linearization technique employed therein to mitigate effects resulted from varactor's non-linear C-V curve are proposed.

According to one aspect of the present invention, a phase shifter including a to phase shifter core and a plurality of load devices is disclosed. The phase shifter core has an input port for receiving an input signal, an output port for outputting an output signal, and a plurality of connection ports. The load devices are coupled to the connection ports, respectively. At least one of the load devices includes a plurality of first varactor units each having a first node and a second node, where first nodes of the first varactor units are coupled to a first voltage, second nodes of the first varactor units are respectively coupled to a plurality of second voltages, and the second voltages include at least two voltages different from each other.

According to another aspect of the present invention, a phase shifter including a phase shifter core and a plurality of load devices is disclosed. The phase shifter core has an input port for receiving an input signal, an output port for outputting an output signal, and a plurality of connection ports. The load devices are coupled to the connection ports, respectively. Each of the load devices includes at least one first varactor unit having a first node and a second node. First nodes of a plurality of first varactor units respectively included in the load devices are coupled to a first voltage, second nodes of the first varactor units are respectively coupled to a plurality of second voltages, and the second voltages include at least two voltages different from each other.

According to yet another aspect of the present invention, a load device including a plurality of first varactor units and at least one first inductive component is disclosed. Each of the first varactor units has a first node and a second node. First nodes of the first varactor units are coupled to a first voltage, and second nodes of the first varactor units are respectively coupled to a plurality of second voltages, where the second voltages include at least two voltages different from each other. The first inductive component is coupled between first nodes of two specific first varactor units of the first varactor units.

The exemplary phase shifter and related load device of the present invention are capable of mitigating effects resulted from vactor's non-linear C-V curve.

DETAILED DESCRIPTION

These and other objectives of the present invention will no doubt become obvious to those of ordinary skill in the art after reading the following detailed description of the preferred embodiment that is illustrated in the various figures and drawings.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

To linearize the C-V curve of the varactor, the present invention proposes two exemplary linearization techniques. One is to divide the varactor into a plurality of varactor units connected in parallel, where the varactor units are provided with different reference voltages (i.e., bias voltages) or control voltages, and the other is to distribute the varactor units in inductive components uniformly or non-uniformly, where the varactor units are provided with different reference voltages (i.e., bias voltages) or control voltages. For clarity, certain exemplary embodiments are given as follows.

Figure 3:
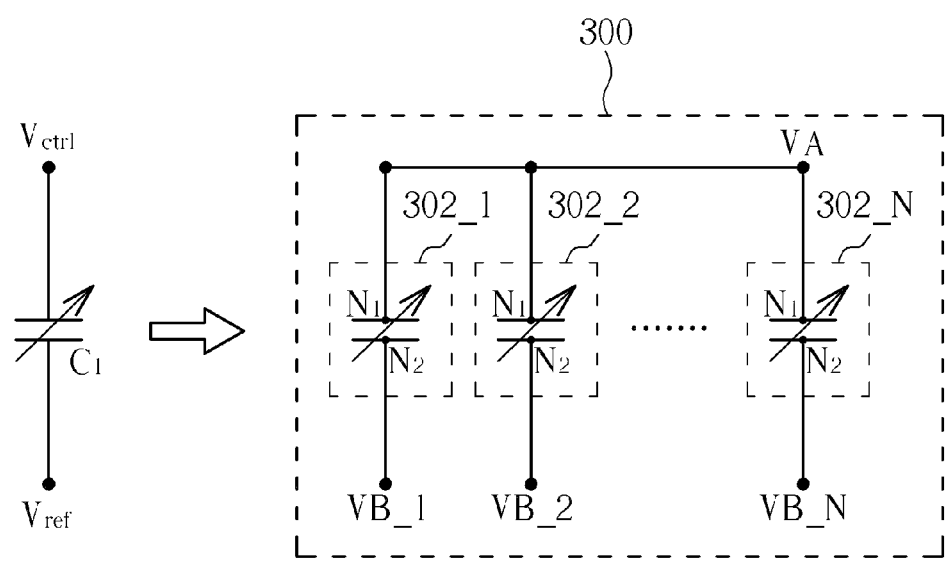
FIG. 3 is a diagram illustrating a first exemplary embodiment of a load device according to the present invention.

FIG. 3 is a diagram illustrating a first exemplary embodiment of a load device according to the present invention. The load device 300 is implemented using the afore-mentioned linearization technique which divides the varactor C1 into a plurality of varactor units 302_1, 302_2, . . . , 302_N connected in parallel. Each of the varactor units 302_1, 302_2, . . . , 302_N has a first node N1 and a second node N2. As shown in FIG. 3, first nodes N1 of the varactor units 302_1, 302_2, . . . , 302_N are coupled to a first voltage VA, and second nodes N2 of the varactor units 302_1, 302_2, . . . , 302_N are coupled to a plurality of second voltages VB_1, VB_2, . . . , VB_N, respectively. It should be noted that the second voltages VB_1, VB_2, . . . , VB_N do not have the same voltage level; that is, the second voltages VB_1, VB_2, . . . , VB_N include at least two voltages different from each other. For example, in one exemplary embodiment, the second voltages VB_1, VB_2, . . . , VB_N are configured to have voltage levels different from each other. It should be noted that the number of the varactor units included in the load device 300 is adjustable, depending upon actual design requirements. In other words, the varactor units 302_1, 302_2, . . . , 302_N as shown in FIG. 3 are for illustrative purposes only.

In general, the capacitive value (capacitance value) of a varactor is determined by a voltage across the varactor. For example, the capacitive value of the varactor C1 is controlled by a voltage difference between a tunable control voltage Vctrl and a fixed reference voltage Vref. Therefore, in one implementation, the first voltage VA is a control voltage configured for tuning capacitive values of the varactor units 302_1, 302_2, . . . , 302_N, and the second voltages VB_1, VB_2, . . . , VB_N serve as reference voltages (e.g., reference voltages each having a fixed voltage level). In another implementation, the first voltage VA serves as a reference voltage (e.g., a reference voltage having a fixed voltage level), and the second voltages VB_1, VB_2, . . . , VB_N are control voltages configured for tuning capacitive values of the varactor units 302_1, 302_2, . . . , 302_N. No matter which implementation is employed, the same objective of tuning the equivalent capacitive value of the load device 300 is achieved.

Figure 1:
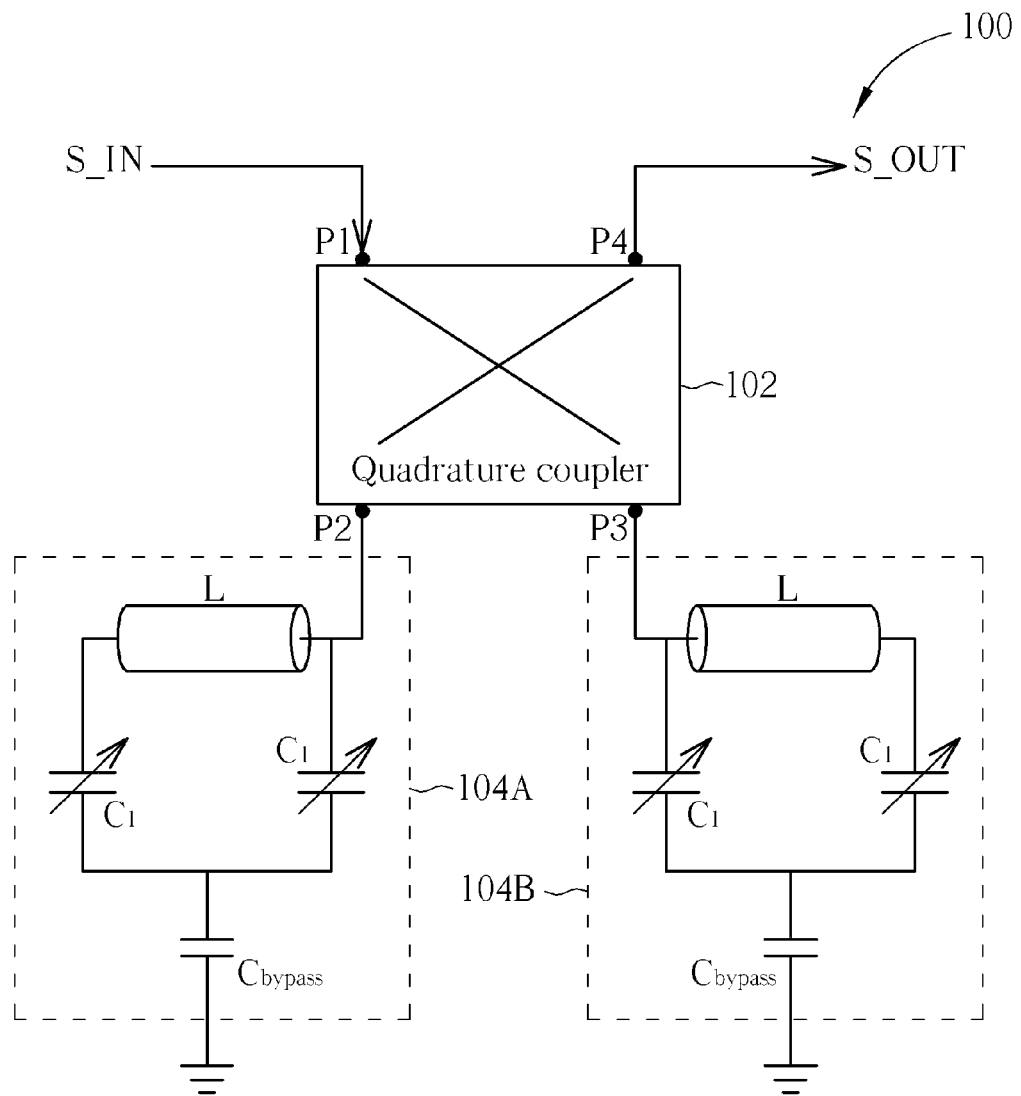
FIG. 1 is a diagram illustrating a conventional reflection-type phase shifter.
Figure 2:
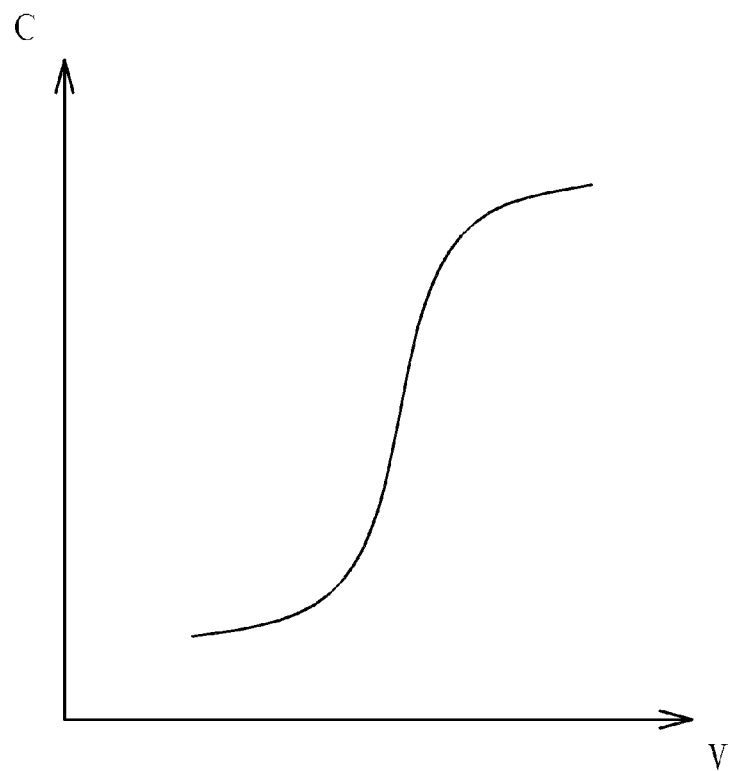
FIG. 2 is a diagram illustrating a varactor's non-linear C-V curve according to the related art.
Figure 4:
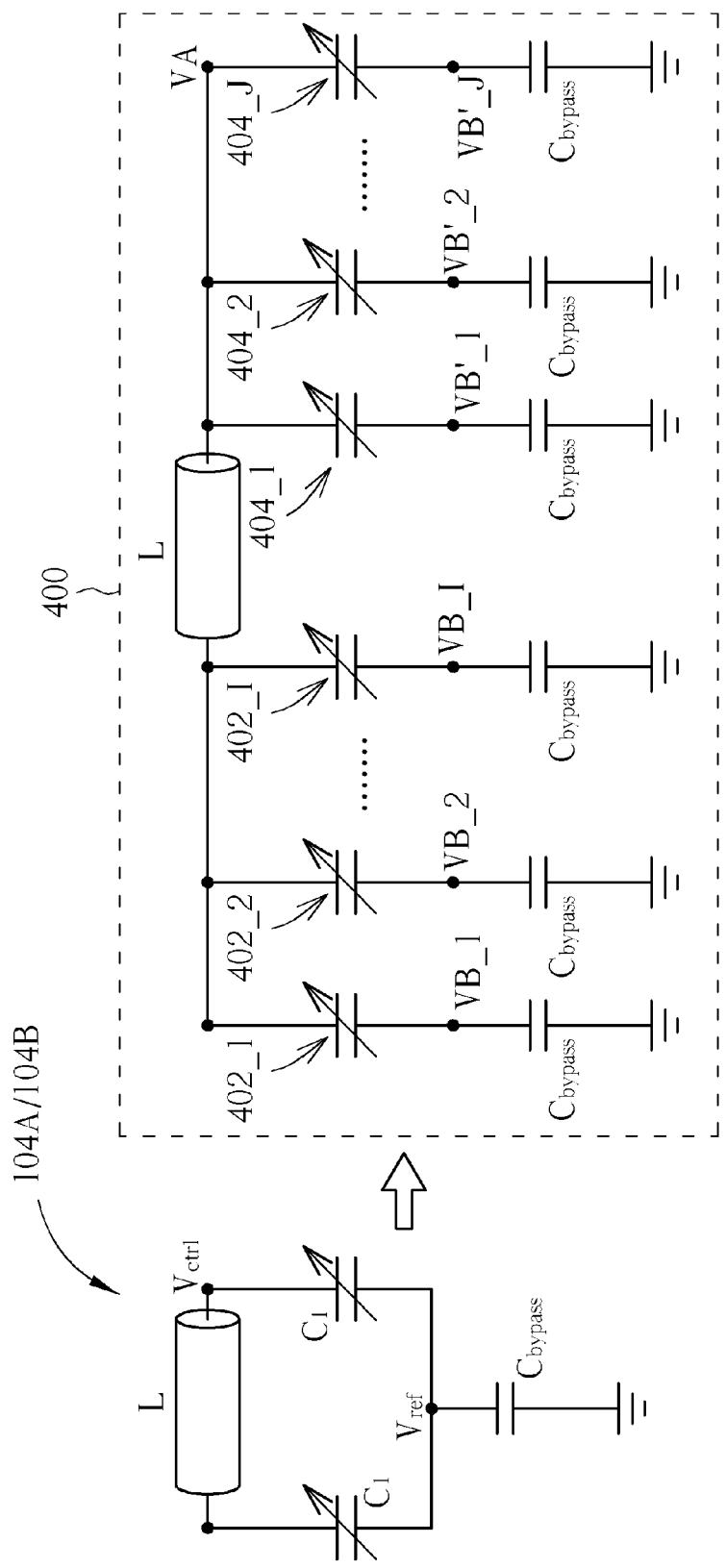
FIG. 4 is a diagram illustrating a second exemplary embodiment of a load device according to the present invention.

Based on the exemplary configuration of the load device 300 shown in FIG. 3, a conventional load device, such as the load device 104A/104B shown in FIG. 1, can be replaced by the exemplary load device 400, as shown in FIG. 4. FIG. 4 is a diagram illustrating a second exemplary embodiment of a load device according to the present invention. The combination of the varactor units 402_, 402_2, . . . , 402_I, having first nodes coupled to the first voltage VA and second nodes respectively coupled to a plurality of second voltages VB_1, VB_2, . . . , VB_I, is used to replace one conventional varactor, and the combination of the varactor units 404_1, 404_2, . . . , 404_J, having first nodes coupled to the first voltage VA and second nodes respectively coupled to a plurality of second voltages VB'_1, VB'_2, . . . , VB'_J, is used to replace another conventional varactor. It should be noted that the number of varactor units 402_1, 402_2, . . . , 402_I can be equal to or different from the number of varactor units 404_1, 404_2, . . . , 404_J, depending upon actual design requirements.

Figure 5:
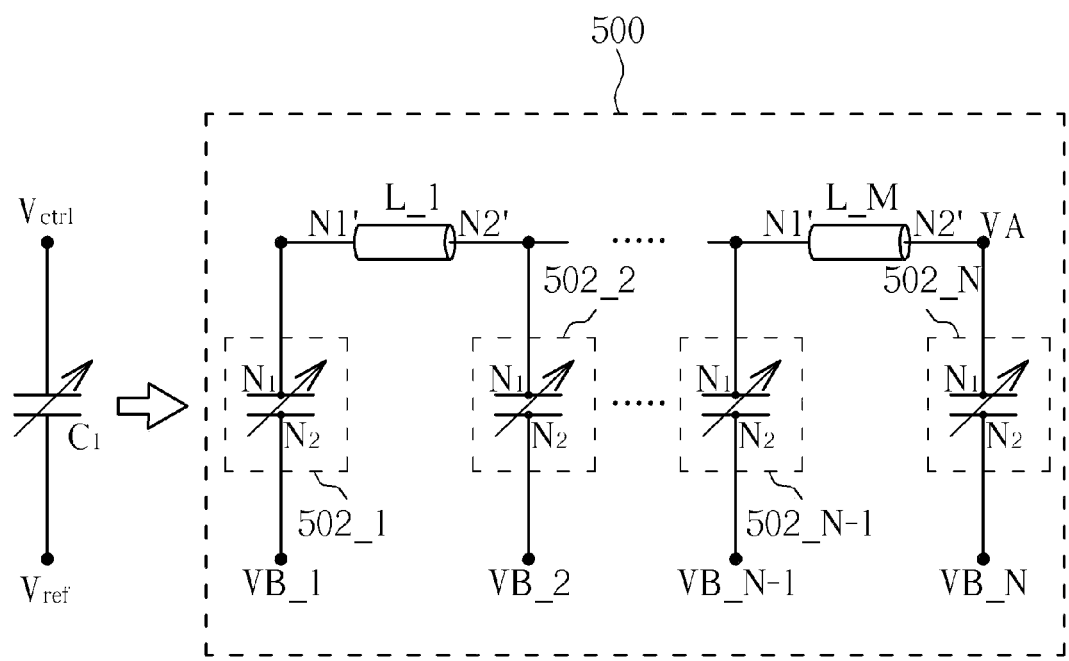
FIG. 5 is a diagram illustrating a third exemplary embodiment of a load device according to the present invention.

FIG. 5 is a diagram illustrating a third exemplary embodiment of a load device according to the present invention. The load device 500 is implemented using the afore-mentioned linearization technique which distributes a plurality of varactor units 502_1, 502_2, . . . , 502_N-1, 502_N in a plurality of inductive components (e.g., transmission lines) L_1, . . . , L_M. Each of the varactor units 502_1, 502_2, . . . , 502_N-1, 502_N has a first node N1 and a second node N2. As shown in FIG. 5, first nodes N1 of the varactor units 502_1, 502_2, . . . , 502_N-1, 502_N are coupled to a first voltage VA, and second nodes N2 of the varactor units 502_1, 502_2, . . . , 502_N-1, 502_N are coupled to a plurality of second voltages VB_1, VB_2, . . . , VB_N-1, VB_N, respectively. Similarly, the second voltages VB_1, VB_2, . . . , VB_N-1, VB_N do not have the same voltage level. That is, the second voltages VB_1, VB_2, . . . , VB_N-1, VB_N include at least two voltages different from each other. For example, in one exemplary embodiment, the second voltages VB_1, VB_2, . . . , VB_N-1, VB_N are configured to have voltage levels different from each other. Moreover, the number of the varactor units and the number of inductive components included in the load device 300 are adjustable, depending upon actual design requirements.

Furthermore, the connection configuration of the varactor units 502_1, 502_2, ..., 502_N-1, 502_N and the inductive components L_1, ..., L_M in FIG. 5 merely serves as one possible implementation. That is, as shown in the exemplary configuration of FIG. 5, each of the inductive components has two nodes N1' and N2', and each of nodes N1', N2' of the inductive components L_1, ..., L_M is coupled to one of the varactor units 502_1, 502_2, ..., 502_N-1, 502_N. However, any load device which includes at least one inductive component (e.g., the inductive component L_1) coupled between first nodes N1 of two specific varactor units (e.g., 502_1 and 502_2) of the varactor units 502_1, 502_2, ..., 502_N-1, 502_N in FIG. 5 still obeys the spirit of the present invention.

As mentioned above, the capacitive value (capacitance value) of a varactor is determined by a voltage across the varactor. Therefore, in one implementation, the first voltage VA in FIG. 5 serves as a control voltage configured for tuning capacitive values of the varactor units 502_1, 502_2, ..., 502_N-1, 502_N, and the second voltages VB_1, VB_2, ..., VB_N-1, VB_N in FIG. 5 are reference voltages (e.g., reference voltages each having a fixed voltage level). In another implementation, the first voltage VA in FIG. 5 serves as a reference voltage (e.g., a reference voltage having a fixed voltage level), and the second voltages VB_1, VB_2, ..., VB_N-1, VB_N in FIG. 5 are control voltages configured for tuning capacitive values of the varactor units 502_1, 502_2, ..., 502_N-1, 502_N.

Figure 6:
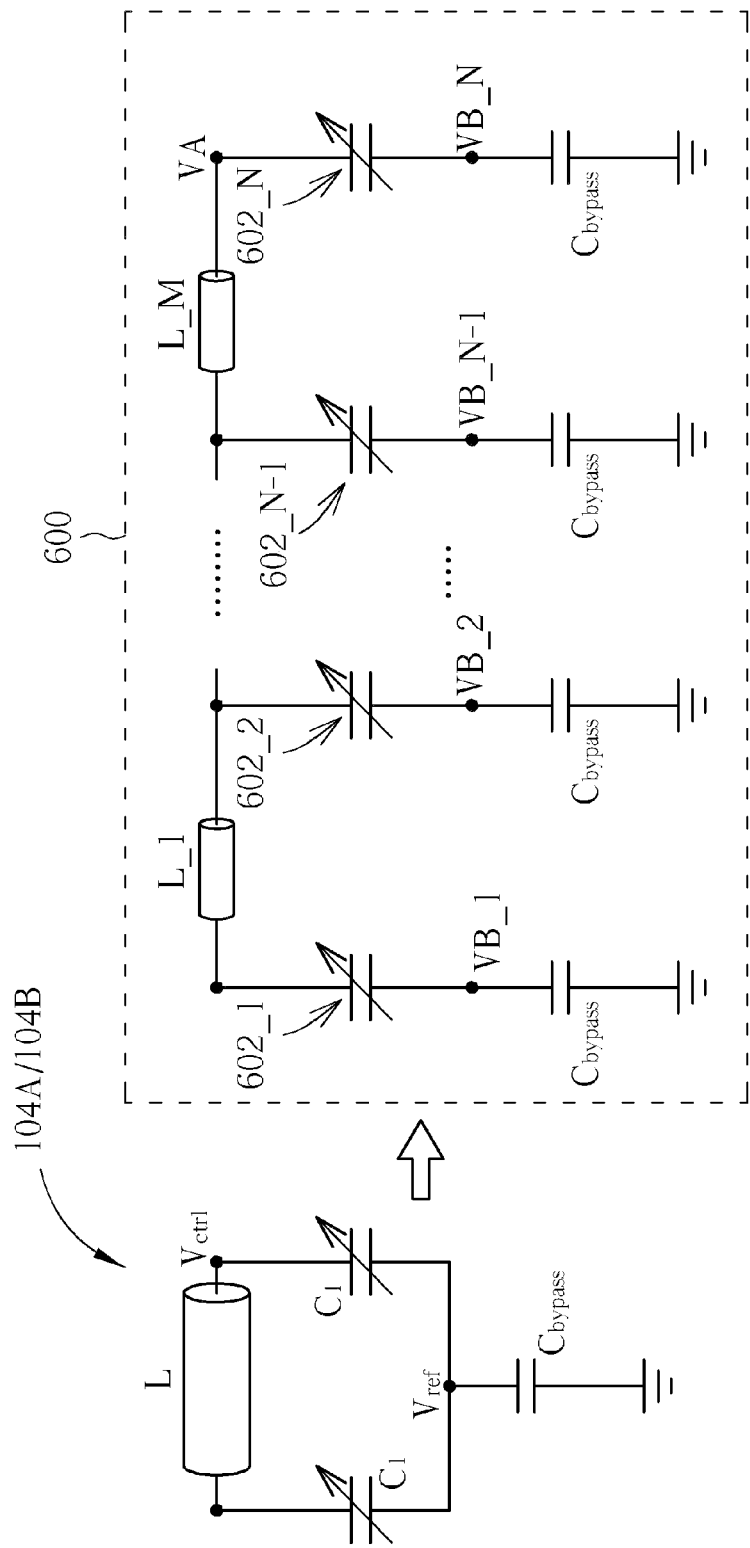
FIG. 6 is a diagram illustrating a fourth exemplary embodiment of a load device according to the present invention.

Please refer to FIG. 6, which is a diagram illustrating a fourth exemplary embodiment of a load device according to the present invention. Based on the exemplary configuration of the load device 500 shown in FIG. 5, a conventional load device, such as the load device 104A/104B shown in FIG. 1, can be replaced by the exemplary load device 600 as shown in FIG. 6, wherein the load device 600 shown in FIG. 6 includes varactor units 602_1, 602_2, ..., 602_N-1, 602_N. As a person skilled in the art can readily understand technical features of the exemplary load device 600 shown in FIG. 6 after reading above paragraphs directed to aforementioned exemplary load devices, further description is omitted here for brevity.

Figure 7:
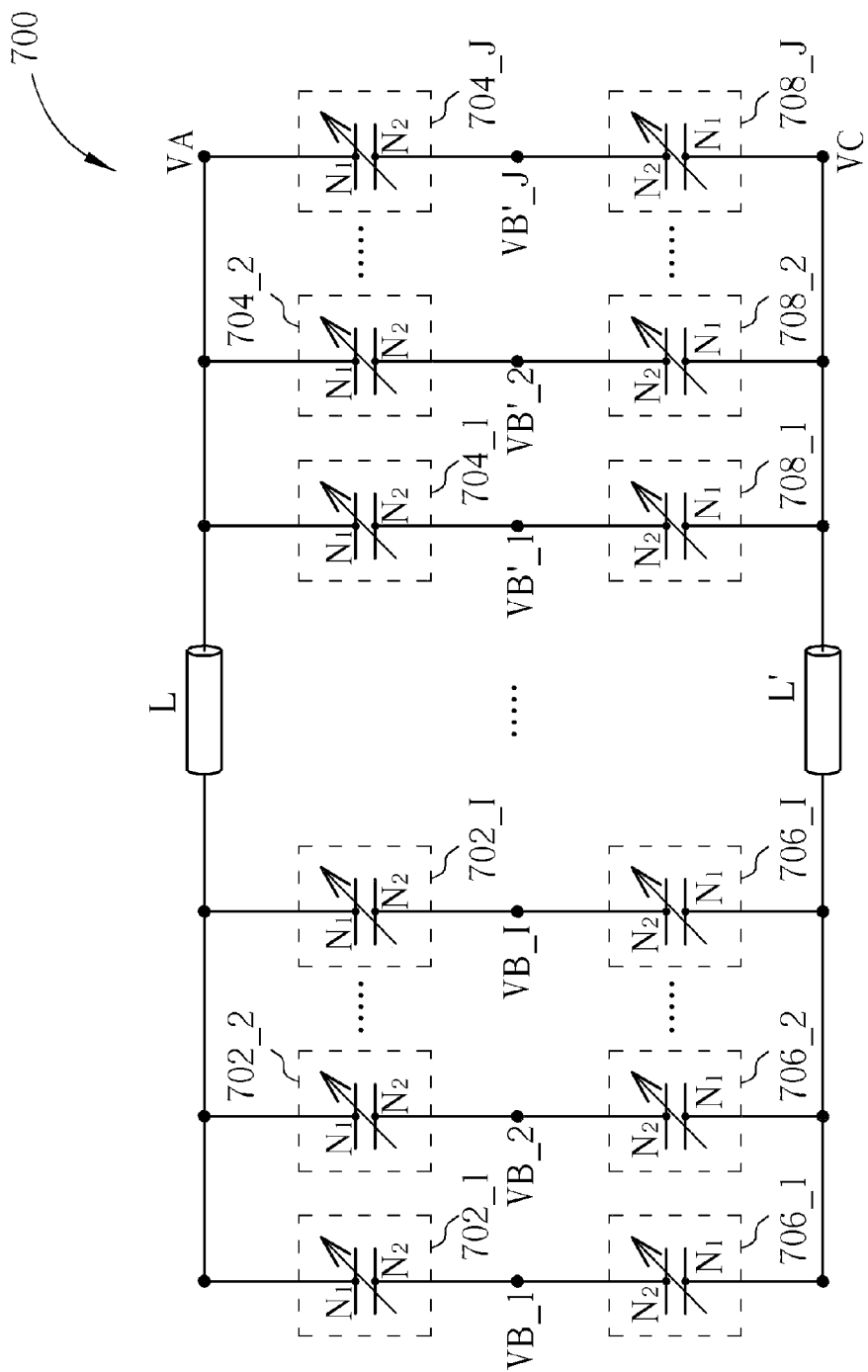
FIG. 7 is a diagram illustrating a fifth exemplary embodiment of a load device according to the present invention.

In above exemplary implementations, the load device is configured using a single-ended topology. However, the load device can also be implemented using a differential topology to meet the requirement of a particular application. For example, the load device arranged in a differential topology can be employed in a differential application device, such as a differential phase shifter. Please refer to FIG. 7 in conjunction with FIG. 4. FIG. 7 is a diagram illustrating a fifth exemplary embodiment of a load device according to the present invention. The load device 700 includes a plurality of first varactor units 702_1, 702_2, ..., 702_I, 704_1, 704_2, ..., 704_J, a plurality of second varactor units 706_1, 706_2, ..., 706_I, 708_1, 708_2, ..., 708_J, and a plurality of inductive components (e.g., transmission lines) L and L', where the first varactor units 702_1, 702_2, ..., 702_I, 704_1, 704_2, ..., 704_J and the second varactor units 706_1, 706_2, ..., 706_I, 708_1, 708_2, ..., 708_J are arranged in a differential topology. The first varactor units 702_1, 702_2, ..., 702_I, 704_1, 704_2, ..., 704_J have first nodes N1 coupled to a first voltage VA, and second nodes N2 respectively coupled to a plurality of second voltages VB_1, VB_2, ..., VB_I, VB'_1, VB'_2, ..., VB'_J. The second varactor units 706_1, 706_2, ..., 706_I, 708_1, 708_2, ..., 708_J have first nodes N1 coupled to a third voltage VC, and second nodes N2 respectively coupled to the aforementioned second voltages VB_1, VB_2, ..., VB_I, VB'_1, VB'_2, ..., VB'_J. Similarly, the second voltages VB_1, VB_2, ..., VB_I have at least two voltages different from each other, and the second voltages VB'_1, VB'_2, ..., VB'_J have at least two voltages different from each other. Besides, the number of the first varactor units 702_1, 702_2, ..., 702_I and the counterpart second varactor units 706_1, 706_2, ..., 706_I, and the number of the first varactor units 704_1, 704_2, ..., 704_J and the counterpart second varactor units 708_1, 708_2, ..., 708_J are adjustable, depending upon actual design requirements.

In one implementation, the first voltage VA and the third voltage VC are control voltages configured for tuning capacitive values of the first varactor units 702_1, 702_2, ..., 702_I, 704_1, 704_2, ..., 704_J and the second varactor units 706_1, 706_2, ..., 706_I, 708_1, 708_2, ..., 708_J, respectively; and the second voltages VB_1, VB_2, ..., VB_I, VB'_1, VB'_2, ..., VB'_J act as reference voltages (e.g., reference voltages each having a fixed voltage level). In another implementation, the first voltage VA and the third voltage VC act as reference voltages (e.g., reference voltages each having a fixed voltage level), and the second voltages VB_1, VB_2, ..., VB_I, VB'_1, VB'_2, ..., VB'_J are control voltages configured for tuning capacitive values of the first varactor units 702_1, 702_2, ..., 702_I, 704_1, 704_2, ..., 704_J and the second varactor units 706_1, 706_2, ..., 706_I, 708_1, 708_2, ..., 708_J.

Figure 8:
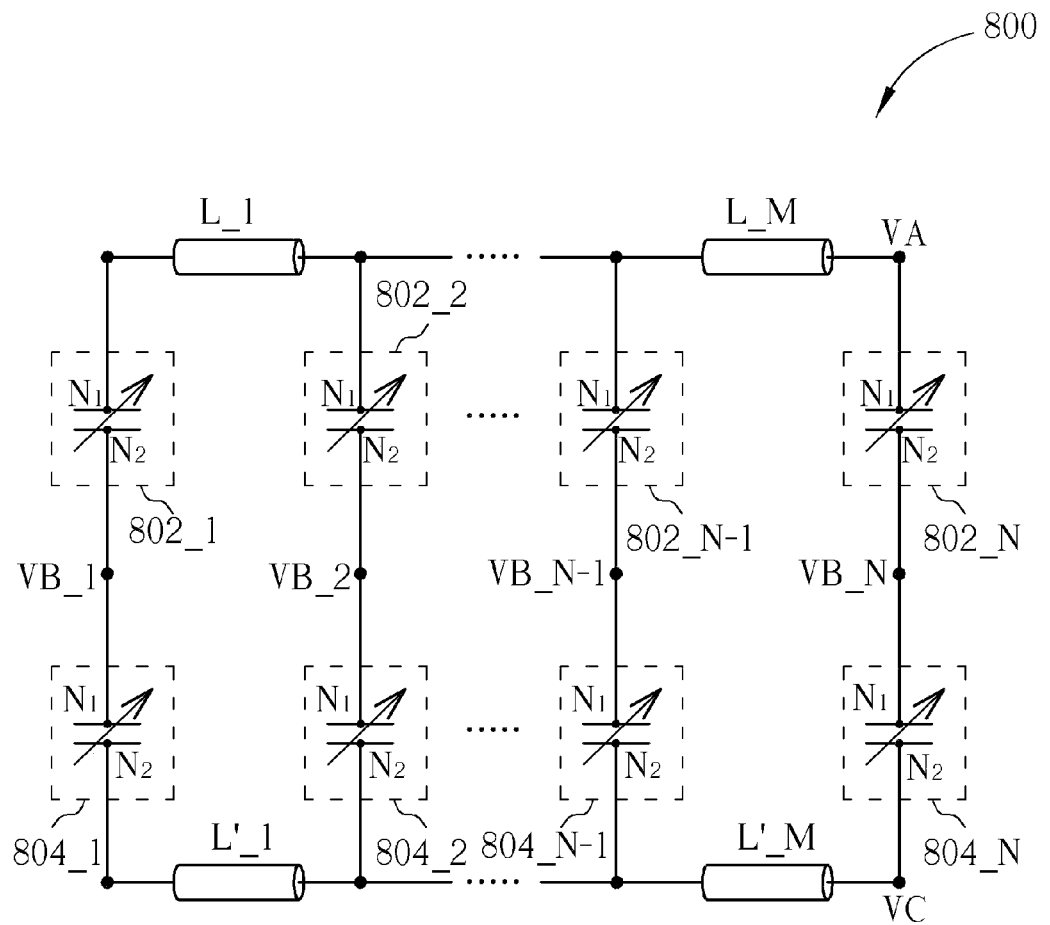
FIG. 8 is a diagram illustrating a sixth exemplary embodiment of a load device according to the present invention.

Please refer to FIG. 8 in conjunction with FIG. 6. FIG. 8 is a diagram illustrating a sixth exemplary embodiment of a load device according to the present invention. The load device 800 is implemented using the afore-mentioned linearization technique which distributes a plurality of first varactor units 802_1, 802_2, ..., 802_N-1, 802_N in a plurality of inductive components (e.g., transmission lines) L_1, ..., L_M, and also distributes a plurality of second varactor units 804_1, 804_2, ..., 804_N-1, 804_N in a plurality of inductive components (e.g., transmission lines) L'_1, ..., L'_M, where the first varactor units 802_1, 802_2, ..., 802_N-1, 802_N and the second varactor units 804_1, 804_2, ..., 804_N-1, 804_N are arranged in a differential topology. Specifically, first nodes N1 of the first varactor units 802_1, 802_2, ..., 802_N-1, 802_N are coupled to a first voltage VA, and second nodes N2 of the first varactor units 802_1, 802_2, ..., 802_N-1, 802 N are coupled to a plurality of second voltages VB_1, VB_2, ..., VB_N-1, VB_N, respectively; regarding the second varactor units 804_1, 804_2, ..., 804_N-1, 804_N, first nodes N1 are coupled to a third voltage VC, and second nodes N2 are coupled to the aforementioned second voltages VB_1, VB_2, ..., VB_N-1, VB_N, respectively. Similarly, the second voltages VB_1, VB_2, ..., VB_N-1, VB_N have at least two voltages different from each other. Besides, the number of the first varactor units 802_1, 802_2, ..., 802_N-1, 802_N and the counterpart second varactor units 804_1, 804_2, ..., 804_N-1, 804_N, and the number of the inductive components L_1, ..., L_M, L'_1, ..., L'_M are adjustable, depending upon actual design requirements.

In one implementation, the first voltage VA and the third voltage VC are control voltages configured for tuning capacitive values of the first varactor units 802_1, 802_2, ..., 802_N-1, 802_N and the second varactor units 804_1, 804_2, ..., 804_N-1, 804_N, respectively; and the second voltages VB_1, VB_2, ..., VB_N-1, VB_N act as reference voltages (e.g., reference voltages each having a fixed voltage level). In another implementation, the first voltage VA and the third voltage VC act as reference voltages (e.g., reference voltages each having a fixed voltage level), and the second voltages VB_1, VB_2, ..., VB_N-1, VB_N are control voltages configured for tuning capacitive values of the first varactor units 802_1, 802_2, ..., 802_N-1, 802_N and the second varactor units 804_1, 804_2, ..., 804_N-1, 804_N.

It should be noted that the above-mentioned differential topology has many benefits/advantages. For example, the insertion loss with the first voltage VA is also linear with that of the third voltage VC; in addition, the bypass capacitors Cbypass used in a single-ended topology can be omitted.

At least one of the exemplary load devices mentioned above can be applied to an application device which requires loads with tunable capacitive values. For instance, a phase shifter employing one or more of the exemplary load devices can have a linearized phase-tuning curve. Taking a phase shifter for example, certain exemplary phase shifter designs are provided as follows for illustrative purposes.

Figure 9:
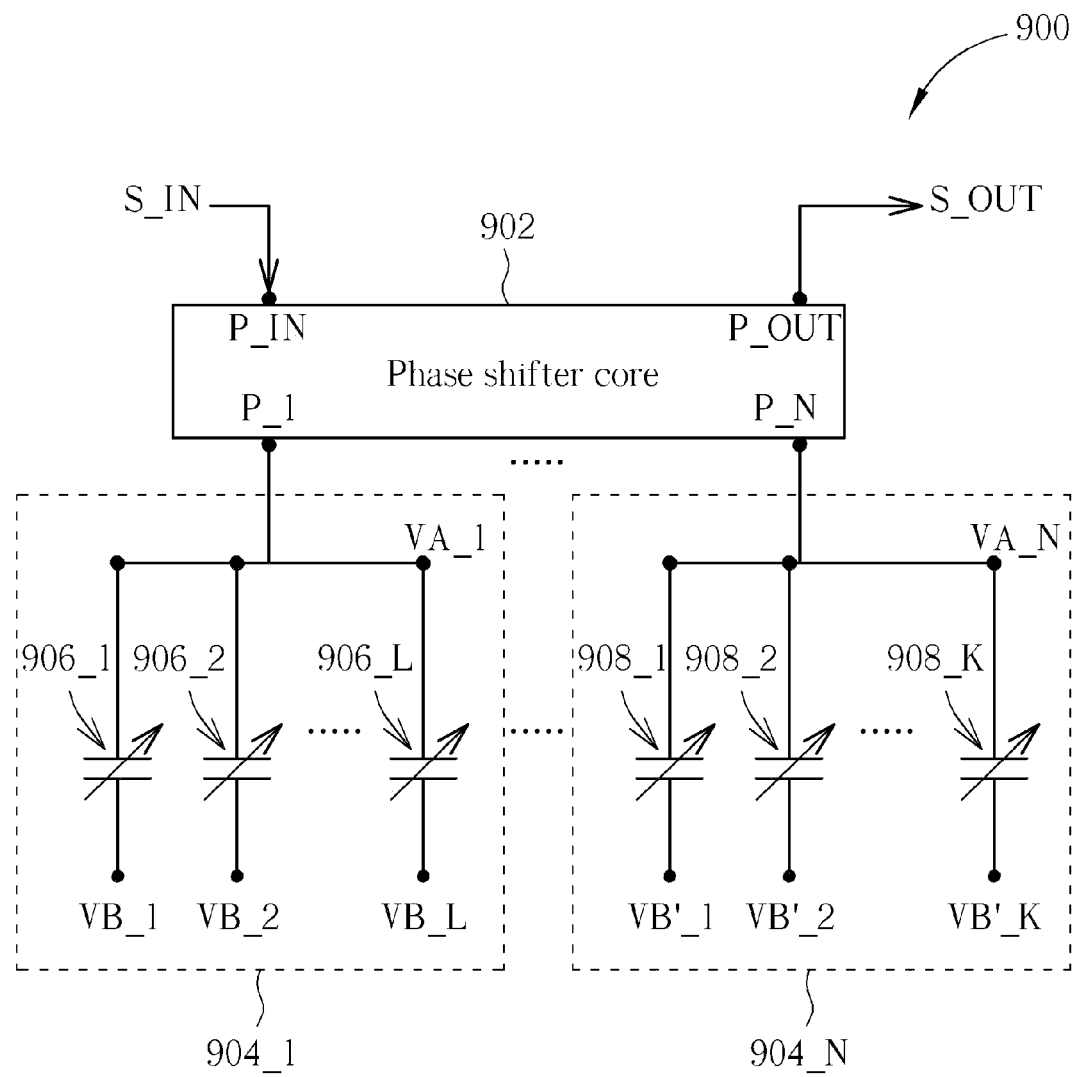
FIG. 9 is a diagram illustrating a first exemplary embodiment of a phase shifter according to the present invention.

FIG. 9 is a diagram illustrating a first exemplary embodiment of a phase shifter according to the present invention. The phase shifter 900 includes a phase shifter core 902 and a plurality of load devices 904_1, ..., 904_N. As the present invention does not focus on the design of the phase shifter core 902, the phase shifter core 902 therefore can be implemented using any available configuration. For example, in a case where the phase shifter 900 is a reflection-type phase shifter, the phase shifter core 902 can be implemented using a quadrature coupler (also called 90-degree hybrid coupler). As shown in FIG. 9, the phase shifter core 902 includes an input port P_IN for receiving an input signal S_IN, an output port P_OUT for outputting an output signal S_OUT, and a plurality of connection ports P_1, ..., P_N, where the number of the connection ports N is an integer equal to or greater than 2 based on the actual architecture of the phase shifter core 902. The load devices 904_1, ..., 904_N are coupled to the connection ports P_1, ..., P_N, respectively. Each of the load devices 904_1, ..., 904_N is implemented using the exemplary load device configuration as shown in FIG. 3. Therefore, the load device 904_1 includes a plurality of varactor units 906_1, 906_2, ..., 906_L having first nodes coupled to a first voltage VA_1 and second nodes respectively coupled to second voltages VB_1, VB_2, ..., VB_L; besides, the load device 904_N includes a plurality of varactor units 908_1, 908_2, ..., 908_K having first nodes coupled to a first voltage VA_N and second nodes respectively coupled to second voltages VB'_1, VB'_2, ..., VB'_K. As the details directed to the load device configuration shown in FIG. 9 and its alternative designs have been described in above paragraphs, further description is omitted here for brevity.

It should be noted that in a case where each of the load devices 904_1, ..., 904_N is arranged in a single-ended topology to satisfy single-ended design requirements, a plurality of bypass capacitors may be included and each of the bypass capacitors is coupled between an AC ground and a corresponding second voltage of the second voltages VB_1, VB_2, ..., VB_L, VB'_1, VB'_2, ..., VB'_K. As a person skilled in the art can readily understand the single-ended configuration of each of the load devices 904_1, ..., 904_N after reading above paragraphs directed to the exemplary load device 400 shown in FIG. 4, further description is omitted here for brevity.

Figure 10:
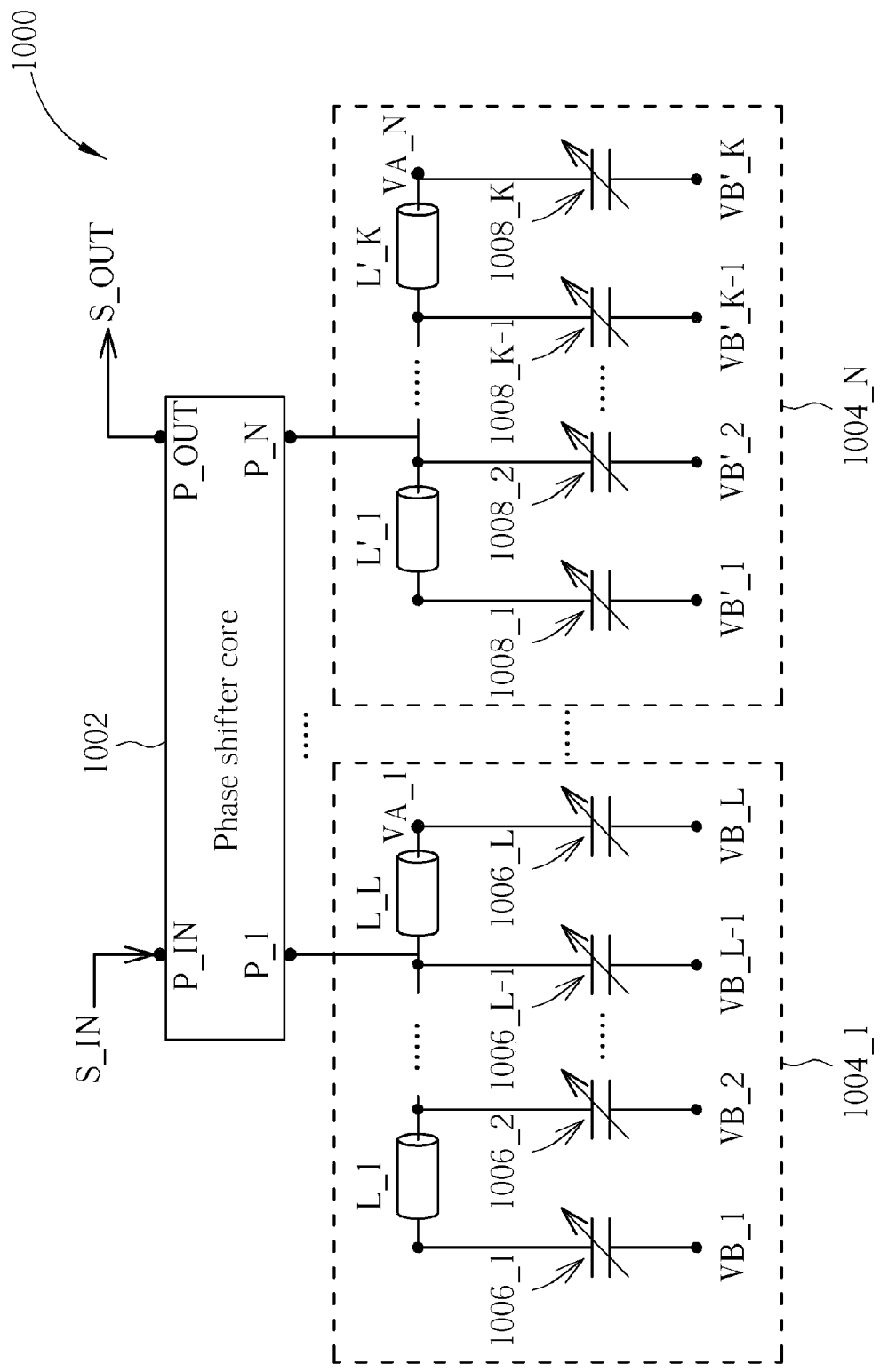
FIG. 10 is a diagram illustrating a second exemplary embodiment of a phase shifter according to the present invention.

FIG. 10 is a diagram illustrating a second exemplary embodiment of a phase shifter according to the present invention. The phase shifter 1000 includes a phase shifter core 1002 and a plurality of load devices 1004_1, ..., 1004_N. Similarly, as the present invention does not focus on the design of the phase shifter core 1002, the phase shifter core 1002 can be implemented using any available configuration, such as a quadrature coupler (90-degree hybrid coupler). The phase shifter core 1002 includes an input port P_IN for receiving an input signal S_IN, an output port P_OUT for outputting an output signal S_OUT, and a plurality of connection ports P_1, ..., P_N, where the number of the connection ports N is an integer equal to or greater than 2 based on the actual architecture of the phase shifter core 1002. The load devices 1004_1, ..., 1004_N are coupled to the connection ports P_1, ..., P_N, respectively. Each of the load devices 1004_1, ..., 1004_N is implemented using the exemplary load device configuration shown in FIG. 5. Therefore, the load device 1004_1 includes a plurality of components L_1, ..., L_K, and a plurality of varactor units 1006_1, 1006_2, ..., 1006_L-1, 1006_L having first nodes coupled to a first voltage VA_1 and second nodes respectively coupled to second voltages VB_1, VB_2, ..., VB_L-1, VB_L; besides, the load device 1004_N includes a plurality of inductive components L'_1, L'_K, and a plurality of varactor units 1008_1, 1008_2, ..., 1008_K-1, 1008_K having first nodes coupled to a first voltage VA_N and second nodes respectively coupled to second voltages VB'_1, VB'_2, ..., VB'_K-1, VB'_K. As the details directed to the load device configuration shown in FIG. 10 and its alternative designs have been described in above paragraphs, further description is omitted here for brevity.

It should be noted that in a case where each of the load devices 1004_1, ..., 1004_N is arranged in a single-ended topology, a plurality of bypass capacitors may be included and each of the bypass capacitors is coupled between an AC ground and a corresponding second voltage of the second voltages VB_1, VB_2, ..., VB_L-1, VB_L, ..., VB'_1, VB'_2, ..., VB'_K-1, VB'_K. As a person skilled in the art can readily understand the single-ended configuration of each of the load devices 1004_1, ..., 1004_N after reading above paragraphs directed to the exemplary load device 600 shown in FIG. 6, further description is omitted here for brevity.

As mentioned above, the load device can be configured in a differential topology, as shown in FIG. 7 and FIG. 8, to meet the requirement of a particular application. Therefore, in alternative designs, the load devices included in the phase shifters 900, 1000 can be replaced by load devices each arranged in a differential topology. These also fall within the scope of the present invention. For example, regarding each of the load devices 904_1, ..., 904_N arranged in a differential topology, each of the second voltages V_1, VB_2, ..., VB_L, ..., VB'_1, VB'_2, ..., VB'_K may act as a virtual ground in an exemplary implementation; similarly, regarding each of the load devices 1004_1, ..., 1004_N arranged in a differential topology, each of the second voltages VB_1, VB_2, ..., VB_L-1, VB_L, ..., VB'_1, VB'_2, ..., VB'_K-1, VB'_K may act as a virtual ground in an exemplary implementation. As a person skilled in the art can readily understand how to arrange components of each of the load devices 904_1, ..., 904_N and 1004_1, ..., 1004_N in a differential topology after reading above paragraphs directed to the exemplary load device 700 shown in FIG. 7 and the exemplary load device 800 shown in FIG. 8, further description is omitted here for brevity.

In view of above, the general conception of the present invention for Linearizing the phase-tuning curve of a phase shifter is to make first nodes of at least two varactor units coupled to a first voltage and second nodes of the at least two varactor units coupled to a plurality of different second voltages, where in one implementation, the first voltage is a control voltage and the second voltages are reference voltages, and in another implementation, the first voltage is a reference voltage and the second voltages are control voltages. In this way, the phase shifter's phase-tuning curve can be effectively linearized due to linearization of the varactor's C-V curve. Based on such an observation, an alternative design of a phase shifter is proposed accordingly. Please refer to FIG. 11, which is a diagram illustrating a third exemplary embodiment of a phase shifter according to the present invention. The phase shifter 1100 includes a phase shifter core 1102 and a plurality of load devices 1104_1, . . . , 1104_N. Similarly, as the present invention does not focus on the design of the phase shifter core 1102, the phase shifter core 1102 can be implemented using any available configuration, such as a quadrature coupler (90-degree hybrid coupler). The phase shifter core 1102 includes an input port P_IN for receiving an input signal S_IN, an output port P_OUT for outputting an output signal S_OUT, and a plurality of connection ports P_1, . . . , P_N, where the number of the connection ports N is an integer equal to or greater than 2 based on the actual architecture of the phase shifter core 1102. The load devices 1104_1, . . . , 1104_N are coupled to the connection ports P_1, . . . , P_N, respectively. Each of the load devices 1104_1, . . . , 1104_N includes at least one varactor unit. In this exemplary embodiment shown in FIG. 11, first nodes N1 of the varactor units 1106_1, . . . , 1106_N are coupled to a first voltage VA, and second nodes N2 of the varactor units 1106_1, . . . , 1106_N are respectively coupled to second voltages VB_1, . . . , VB_N including at least two voltages different from each other. For instance, all of the second voltages VB_1, . . . , VB_N are different from each other.

Figure 11:
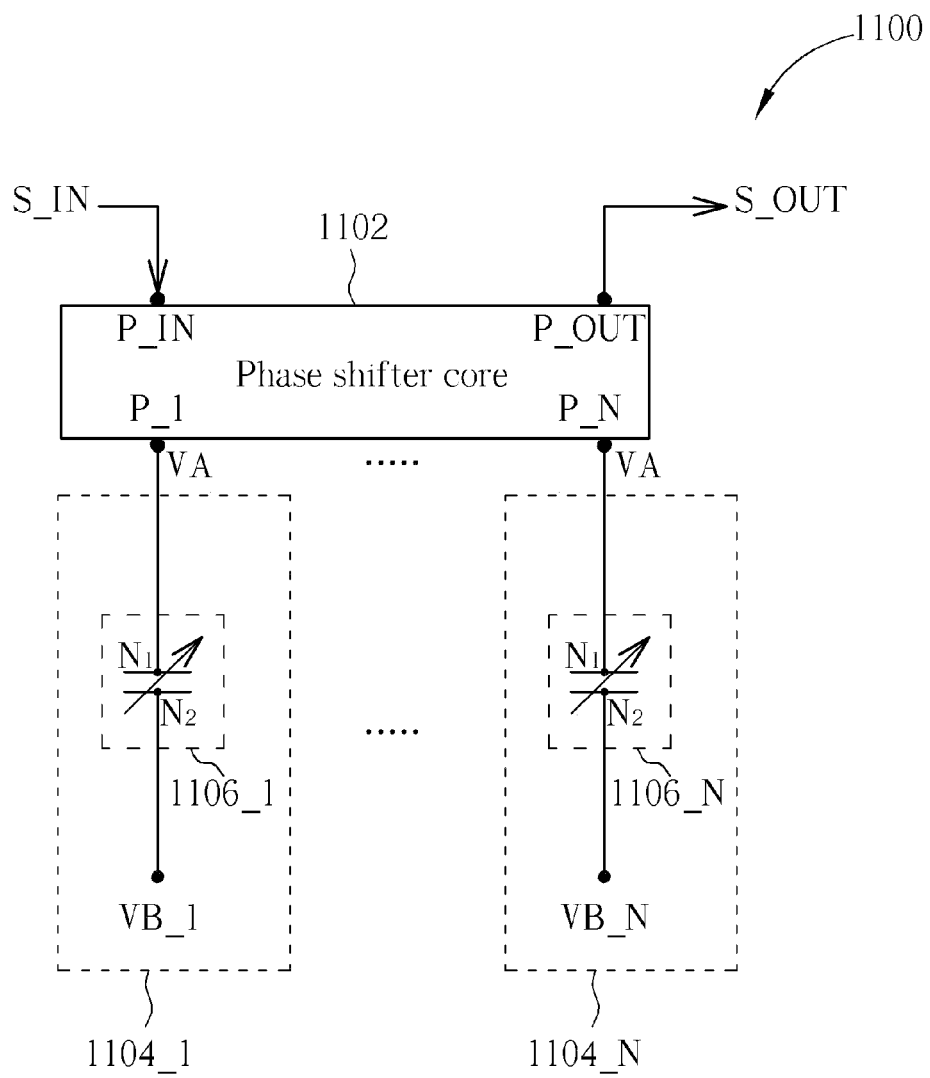
FIG. 11 is a diagram illustrating a third exemplary embodiment of a phase shifter according to the present invention.
Figure 12:
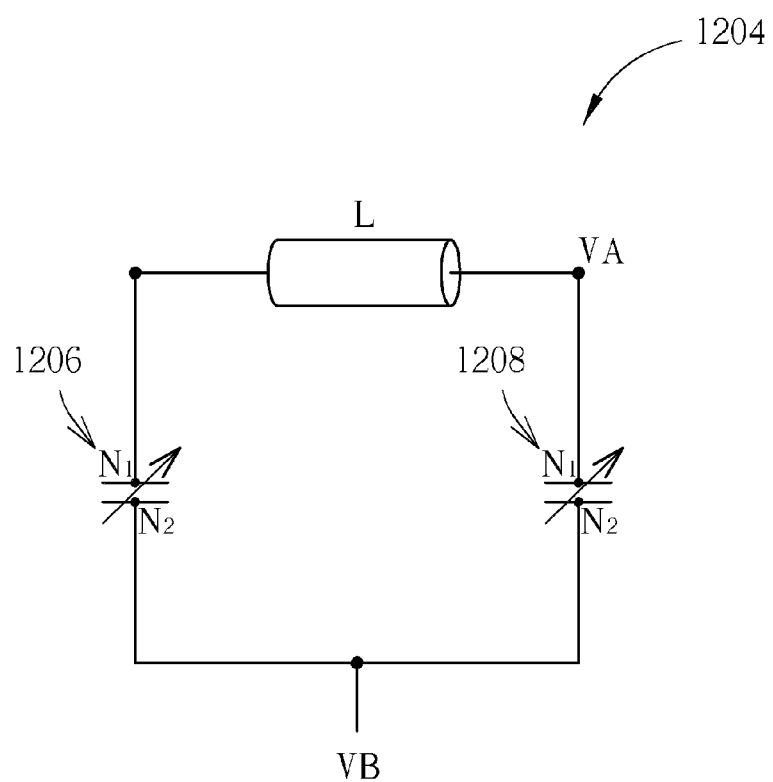
FIG. 12 shows an alternative design of a load device used in the exemplary phase shifter shown in FIG. 11.

In FIG. 11, each load device is shown having a single varactor unit included therein. However, without departing from the spirit of the present invention, the load device shown in FIG. 11 can also be configured to include more than one varactor coupled between the first voltage and the second voltage. FIG. 12 shows an alternative design of a load device used in the exemplary phase shifter 1100 shown in FIG. 11. The exemplary load device 1204 shown in FIG. 12 includes a plurality of varactor units 1206, 1208 and one inductive component (e.g., a transmission line) L coupled between the varactor units 1206, 1208. As can be seen from FIG. 12, each of the varactor units 1206, 1208 has a first node N1 coupled to the first voltage VA and a second node N2 coupled to a second voltage VB. It should be noted that any variation/modification based on the exemplary load device 1204 shown in FIG. 12 still obeys the spirit of the present invention. For example, taking the load device 1204 as a basic unit, a load device with more than two varactor units each coupled between the first voltage VA and the second voltage VB can be easily derived.

It should be noted that in a case where each of the load devices 1104_1, . . . , 1104_N is arranged in a single-ended topology to satisfy single-ended design requirements, a plurality of bypass capacitors may be included and each of the bypass capacitors is coupled between an AC ground and a corresponding second voltage of the second voltages VB_1, . . . , VB_N. As a person skilled in the art can readily understand the single-ended configuration of each of the load devices 1104_1, . . . , 1104_N after reading above paragraphs directed to the exemplary load device 400 shown in FIG. 4 and the exemplary load device 600 shown in FIG. 6, further description is omitted here for brevity.

Figure 13:
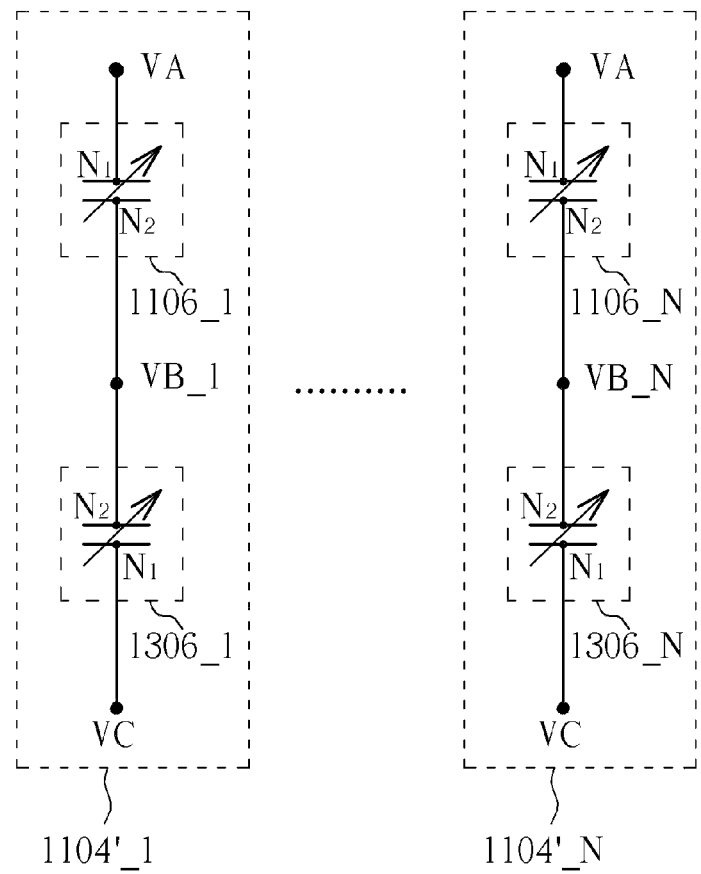
FIG. 13 is a diagram illustrating an exemplary implementation of load devices configured in a differential topology.

Furthermore, the load device can also be configured in a differential topology to meet the requirement of a particular application, such as a differential phase shifter. Therefore, in an alternative phase shifter design, the load devices 1104_1, . . . , 1104_N included in the phase shifter 1100 can be replaced by load devices 1104'_1, . . . , 1104'_N each arranged in a differential topology. That is, in a case where each of the load devices 1104_1, . . . , 1104_N is arranged in a differential topology, each of the second voltages VB_1, . . . , VB_N may act as a virtual ground in an exemplary implementation of the present invention. As shown in FIG. 13, the load device 1104'_1 includes the varactor unit 1106_1 in FIG. 11 and another varactor unit 1306_1, where the first node N1 and second node N2 of the varactor unit 1106_1 are respectively coupled to the first voltage VA and the second voltage VB_1, and the first node N1 and second node N2 of the varactor unit 1306_1 are respectively coupled to a third voltage VC and the second voltage VB_1; besides, the load device 1104'_N includes the varactor unit 1106_N in FIG. 11 and another varactor unit 1306_N, where the first node N1 and second node N2 of the varactor unit 1106_N are respectively coupled to the first voltage VA and the second voltage VB_N, and the first node N1 and second node N2 of the varactor unit 1306_N are respectively coupled to the third voltage VC and the second voltage VB_N. Specifically, in one implementation, the first voltage VA and the third voltage VC serve as control voltages configured for tuning the capacitive values of the varactor units 1106_1, . . . , 1106_N, 1306_1, . . . , 1306_N, and the second voltages VB_1, . . . , VB_N serve as reference voltages (e.g., reference voltages each having a fixed voltage level). In another implementation, the second voltages VB_1, . . . , VB_N serve as control voltages configured for tuning the capacitive values of the varactor units 1106_1, . . . , 1106_N, 1306_1, . . . , 1306_N, and the first voltage VA and the third voltage VC are reference voltages (e.g., reference voltages each having a fixed voltage level).

Moreover, if the result is substantially the same, additional components can be added to the exemplary phase shifters 900, 1000, 1100. For example, in each of the exemplary phase shifters 900, 1000, 1100, one capacitor with large capacitive value can be inserted between a connection port and a corresponding load device.

In one exemplary embodiment, the control voltage applied to the varactor unit mentioned above can be generated from a digital-to-analog converter (DAC) which converts a digital control value into the desired control voltage. In an alternative design, a direct digital control of the control voltage can be employed. Take the load device 400 shown in FIG. 4 for example. In a case where the first voltage serves as a reference voltage for all varactor units, and each of the second voltages VB_1, VB_2, . . . , VB_N serves as the control voltage for a corresponding varactor unit, each control voltage is digitally controlled to have either a first voltage level (e.g., VDD) corresponding to a logic high value "1" or a second voltage level (e.g., GND) corresponding to a logic low value "0". In other words, each of the varactor units is controlled to have either a maximum capacitive value or a minimum capacitive value. In this way, with proper control of the control voltages, a desired capacitive value of the load device can be set. More specifically, the total number of the implemented varactor units depends upon the requirement of the desired capacitance resolution and range. It should be noted that aforementioned digital control scheme of the control voltage is applicable to each of the exemplary load devices mentioned above.

Figure 14:
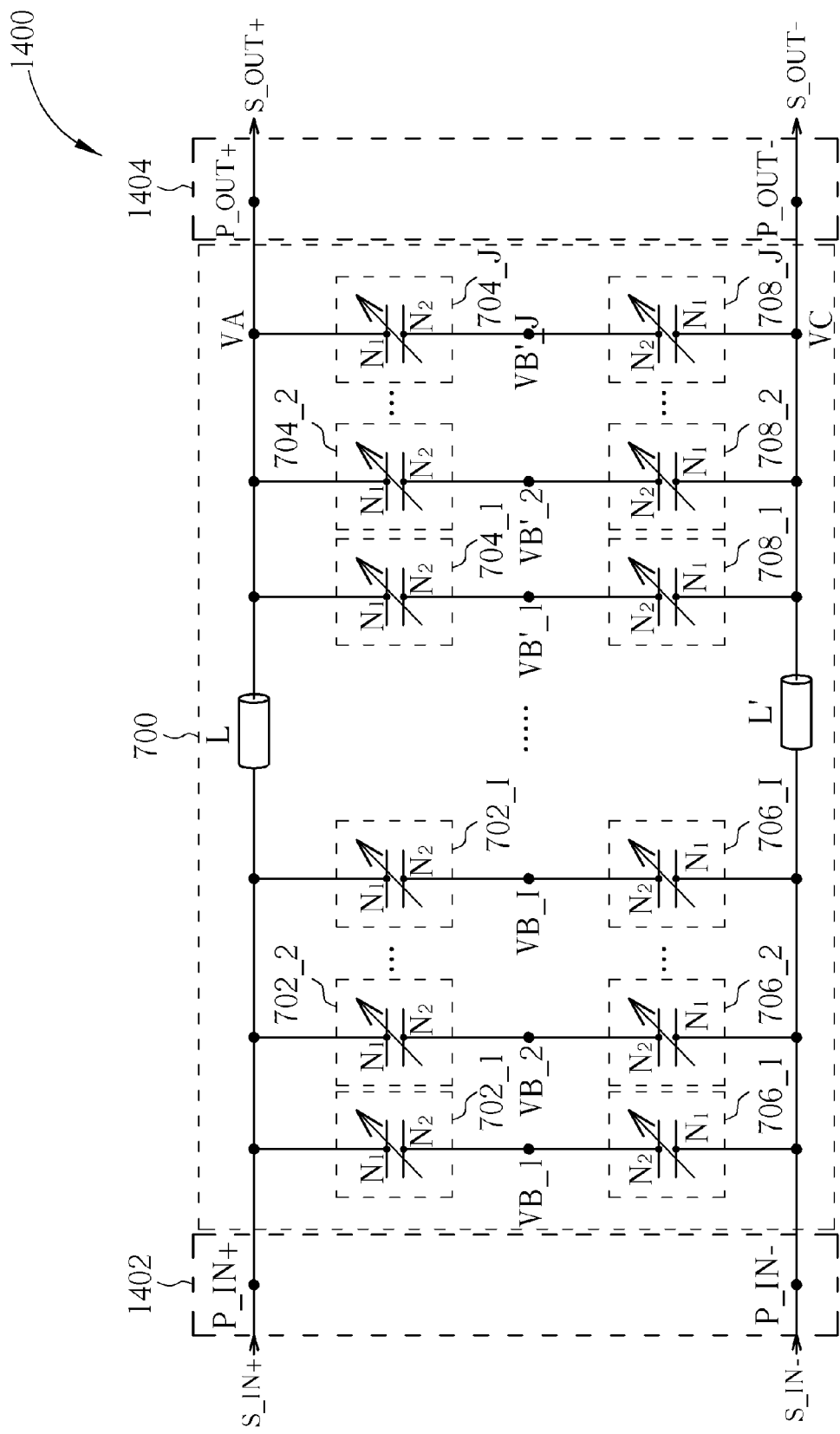
FIG. 14 is a diagram illustrating a fourth exemplary embodiment of a phase shifter according to the present invention.

In each exemplary phase shifter 900, 1000, 1100 mentioned above, the phase shifter core 902, 1002, 1102 is a required element; however, this by no means implies that any phase shifter having the exemplary load device(s) of the present invention implemented therein should include a phase shifter core, such as a quadrature coupler. FIG. 14 is a diagram illustrating a fourth exemplary embodiment of a phase shifter according to the present invention. The phase shifter 1400 includes the load device 700 as shown in FIG. 7, and is utilized to generate a differential output signal, including S_OUT+ and S_OUT−, at a differential output port 1404 according to a differential input signal, including S_IN+ and S_IN−, received at a differential input port 1402. It should be noted that there is no phase shifter core employed in the phase shifter 1400. By way of example, not limitation, the core function of the phase shifter 1400 is realized solely by the load device 700 configured using a differential topology. Therefore, as can be seen from FIG. 14, the first node N1 of the first varactor unit 702_1 and the first node N1 of the second varactor unit 706_1 are coupled to a first input terminal P_IN+ and a second input terminal P_IN− of the differential input port 1402, respectively, and a first node N1 of the first varactor unit 704_J and the first node N1 of the second varactor unit 708_J are coupled to a first output terminal P_OUT+ and a second output terminal P_OUT− of the differential output port 1404, respectively.

Figure 15:
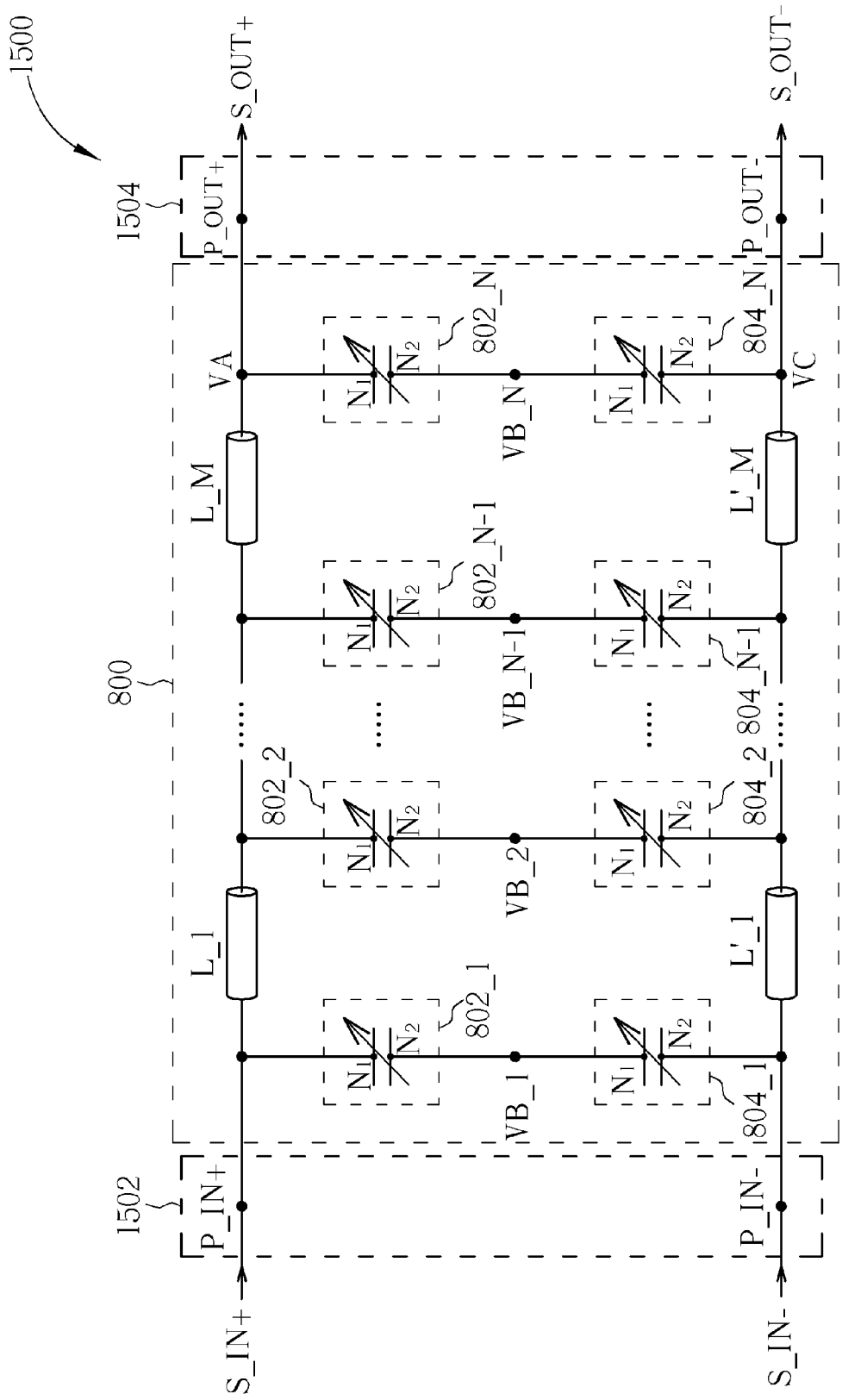
FIG. 15 is a diagram illustrating a fifth exemplary embodiment of a phase shifter according to the present invention.

FIG. 15 is a diagram illustrating a fifth exemplary embodiment of a phase shifter according to the present invention. The phase shifter 1500 includes the load device 800 as shown in FIG. 8, and is utilized to generate a differential output signal, including S_OUT+ and S_OUT−, at a differential output port 1504 according to a differential input signal, including S_IN+ and S_IN−, received at a differential input port 1502. It should be noted that there is no phase shifter core employed in the phase shifter 1500. By way of example, not limitation, the core function of the phase shifter 1500 is realized solely by the load device 800. Therefore, as can be seen from FIG. 15, the first node N1 of the first varactor unit 802_1 and the first node N1 of the second varactor unit 804_1 are coupled to a first input terminal P_IN+ and a second input terminal P_IN− of the differential input port 1502, respectively, and a first node N1 of the first varactor unit 802_N and the first node N1 of the second varactor unit 804_N are coupled to a first output terminal P_OUT+ and a second output terminal P_OUT− of the differential output port 1504, respectively.

Moreover, if the result is substantially the same, additional components (e.g., capacitors with large capacitive values) are allowed to be inserted between the load device 700, 800 and the differential input port 1402, 1502; similarly, additional components (e.g., capacitors with large capacitive values) are allowed to be inserted between the load device 700, 800 and the differential output port 1404, 1504.

Please note that the number of circuit components included in each of the above-mentioned exemplary load devices and phase shifters of the present invention is for illustrative purposes only. For example, the number of varactor units of one exemplary load device shown in one figure of the present invention by no means implies that another exemplary load device shown in another figure of the present invention is required to have the same or different number of varactor units implemented therein; the number of inductive components of one exemplary load device shown in one figure of the present invention by no means implies that another exemplary load device shown in another figure of the present invention is required to have the same or different number of inductive components implemented therein; and the number of load devices of one exemplary phase shifter shown in one figure of the present invention by no means implies that another exemplary phase shifter shown in another figure of the present invention is required to have the same or different number of load devices implemented therein. In short, based on the actual design requirements, the number of circuit components included in each of the above-mentioned exemplary load devices and phase shifters of the present invention is adjustable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase shifter, comprising:
 a phase shifter core, having an input port for receiving an input signal, an output port for outputting an output signal, and a plurality of connection ports; and
 a plurality of load devices, coupled to the connection ports, respectively, at least one of the load devices comprising:
  a plurality of first varactor units each having a first node, coupled to a corresponding connection port, and a second node, wherein first nodes of the first varactor units are coupled to a first voltage, second nodes of the first varactor units are respectively coupled to a plurality of second voltages, the second voltages include at least two voltages different from each other, and either the first voltage or the second voltages are variable for tuning capacitive values of the first varactor units; and
  a plurality of second varactor units each having a first node and a second node, wherein the first varactor units and the second varactor units are arranged in a differential topology, first nodes of the second varactor units are coupled to a third voltage, and second nodes of the second varactor units are respectively coupled to the second voltages.

2. The phase shifter of claim 1, wherein the first voltage is a reference voltage, and the second voltages are control voltages configured for tuning capacitive values of the first varactor units.

3. The phase shifter of claim 2, wherein at least one of the control voltages is digitally set to have either a first voltage level corresponding to a logic high value or a second voltage level corresponding to a logic low value.

4. The phase shifter of claim 1, wherein the at least one of the load devices further comprises:
 at least one inductive component, coupled between first nodes of two specific first varactor units included in the first varactor units.

5. The phase shifter of claim 4, wherein the at least one of the load devices comprises a plurality of inductive components including the at least one inductive component, each of the inductive components has two nodes, and each of nodes of the inductive components is coupled to at least one of the first varactor units.

6. The phase shifter of claim 1, wherein the first voltage is a control voltage configured for tuning capacitive values of the first varactor units, and the second voltages are reference voltages.

7. A load device for being coupled to a connection port of a phase shift core, comprising:
 a plurality of first varactor units each having a first node coupled to the connection port and a second node, first nodes of the first varactor units being coupled to a first voltage, second nodes of the first varactor units being respectively coupled to a plurality of second voltages, wherein the second voltages include at least two voltages different from each other, and either the first voltage or the second voltages are variable for tuning capacitive values of the first varactor units;
 at least one first inductive component, coupled between first nodes of two specific first varactor units of the first varactor units;
 a plurality of second varactor units each having a first node and a second node, first nodes of the second varactor units being coupled to a third voltage, second nodes of the second varactor units being respectively coupled to the second voltages; and at least a second inductive component, coupled between first nodes of two specific second varactor units of the second varactor units;

wherein the first varactor units and the second varactor units are arranged in a differential topology.

8. The load device of claim 7, wherein the first voltage is a reference voltage, and the second voltages are control voltages configured for tuning capacitive values of the first varactor units.

9. The load device of claim 8, wherein at least one of the control voltages is digitally set to have either a first voltage level corresponding to a logic high value or a second voltage level corresponding to a logic low value.

10. The load device of claim 7, comprising a plurality of first inductive components including the at least one first inductive component;

wherein each of the first inductive components has two nodes, and each node of a plurality of nodes of the first inductive components is coupled to at least one of the first varactor units.

11. The load device of claim 7, wherein the first voltage is a control voltage configured for tuning capacitive values of the first varactor units, and the second voltages are reference voltages.

12. The load device of claim 7, being employed in a phase shifter which generates a differential output signal at a differential output port according to a differential input signal received at a differential input port, wherein a first node of one of the first varactor units and a first node of one of the second varactor units are coupled to a first input terminal and a second input terminal of the differential input port of the phase shifter, respectively, and a first node of another of the first varactor units and a first node of another of the second varactor units are coupled to a first output terminal and a second output terminal of the differential output port of the phase shifter, respectively.

13. The load device of claim 7, being employed in a phase shifter.

14. A phase shifter, comprising:

a phase shifter core, having an input port for receiving an input signal, an output port for outputting an output signal, and a plurality of connection ports; and a plurality of load devices, coupled to the connection ports, respectively, at least one of the load devices comprises a plurality of first varactor units each having a first node and a second node, and further comprises at least an inductive component coupled between first nodes of two specific first varactor units included in the first varactor units, each of the load devices further comprising:

a second varactor unit having a first node and a second node, the second varactor unit and the first varactor unit being arranged in a differential topology;

wherein first nodes of a plurality of second varactor units respectively included in the load devices are coupled to a third voltage, and second nodes of the second varactor units are respectively coupled to second voltages.

15. The phase shifter of claim 14, wherein first nodes of the plurality of first varactor units are coupled to a first voltage, second nodes of the plurality of first varactor units are coupled to a plurality of second voltages, and the first voltage is a reference voltage, and the second voltages are control voltages configured for tuning capacitive values of the first varactor units.

16. The phase shifter of claim 15, wherein at least one of the control voltages is digitally set to have either a first voltage level corresponding to a logic high value or a second voltage level corresponding to a logic low value.

17. The phase shifter of claim 14, wherein first nodes of the plurality of first varactor units are coupled to a first voltage, second nodes of the plurality of first varactor units are coupled to a plurality of second voltages, and the first voltage is a control voltage configured for tuning capacitive values of the first varactor units, and the second voltages are reference voltages.

18. The phase shifter of claim 14, wherein at least one of the load devices comprises a plurality of first varactor units each having a first node and a second node respectively coupled to the first voltage and one of the second voltages, and further comprises at least an inductive component coupled between first nodes of two specific first varactor units included in the first varactor units.

* * * * *

UNITED STATES PATENT AND TRADEMARK OFFICE
CERTIFICATE OF CORRECTION

PATENT NO. : 9,231,549 B2
APPLICATION NO. : 13/380511
DATED : January 5, 2016
INVENTOR(S) : Ming-Da Tsai et al.

Page 1 of 1

It is certified that error appears in the above-identified patent and that said Letters Patent is hereby corrected as shown below:

On the title page, item (54) and in the specification, column 1, line 1, correct the title of the invention from "PHASE SHIFTER AND AND RELATED LOAD DEVICE" to

--PHASE SHIFTER AND RELATED LOAD DEVICE--

Signed and Sealed this
Twenty-first Day of June, 2016

Michelle K. Lee
*Director of the United States Patent and Trademark Office*